United States Patent [19]

Tanski et al.

[11] Patent Number: 5,320,977
[45] Date of Patent: Jun. 14, 1994

[54] METHOD AND APPARATUS FOR SELECTING THE RESISTIVITY OF EPITAXIAL LAYERS IN III-V DEVICES

[75] Inventors: William J. Tanski, Glastonbury; Emilio J. Branciforte, Cromwell, both of Conn.

[73] Assignee: United Technologies Corporation, Hartford, Conn.

[21] Appl. No.: 821,239

[22] Filed: Jan. 10, 1992

Related U.S. Application Data

[63] Continuation-in-part of Ser. No. 475,738, Feb. 6, 1990, abandoned.

[51] Int. Cl.$^5$ ............................................. H01G 7/00
[52] U.S. Cl. .................................... 437/81; 437/39; 437/126; 437/133; 437/901; 310/313 R
[58] Field of Search .............. 437/7, 39, 40, 41, 81, 437/126, 133, 225, 901, 912; 156/610–614; 148/33, 33.2, 33.4, DIG. 51, DIG. 56, DIG. 65, DIG. 72, DIG. 53, DIG. 146, DIG. 149; 310/313 R, 313 A, 313 B, 313 D; 352/16, 17, 26

[56] References Cited

U.S. PATENT DOCUMENTS

| | | | |
|---|---|---|---|
| 4,633,285 | 12/1986 | Hunsinger et al. | 357/26 |
| 4,695,790 | 9/1987 | Mathis | 324/77 K |
| 4,839,708 | 6/1989 | Kano | 357/26 |
| 4,884,001 | 11/1989 | Sacks et al. | 357/26 |
| 4,906,586 | 3/1990 | Blackburn | 437/40 |
| 4,926,083 | 5/1990 | Merritt et al. | 310/313 R |
| 4,935,935 | 6/1990 | Reed et al. | 372/44 |

FOREIGN PATENT DOCUMENTS

| | | | |
|---|---|---|---|
| 58-171865 | 10/1983 | Japan | 357/26 |
| 60-83379 | 5/1985 | Japan | 437/7 |

OTHER PUBLICATIONS

Howes et al, "Gallium Arsenide Materials, Devices and Circuits", John Wiley and Sons, Chichester U.K. 1985 pp. 123–125.

Primary Examiner—Robert Kunemund
Attorney, Agent, or Firm—McCormick, Paulding & Huber

[57] ABSTRACT

A novel heterostructure acoustic charge transport (HACT) device is disclosed having an optimized charge density. The device includes a transducer fabricated on a substrate structure that launches surface acoustic Waves. A reflector is formed in the substrate structure at an end portion adjacent to the transducer for reflecting the surface acoustic waves. Also included is an electrode configured with the transport channel at an end thereof distal to the transducer for generating electrical signal equivalents of the propagating electrode charge. During fabrication, the resistivity of the layers initially configured at a lower than desired value. The layer is subsequently etched to raise the resistivity to the desired value.

8 Claims, 1 Drawing Sheet

METHOD AND APPARATUS FOR SELECTING THE RESISTIVITY OF EPITAXIAL LAYERS IN III-V DEVICES

This is a continuation-in-part of a co-pending application Ser. No. 07/475,738 filed on Feb. 6, 1990, now abandoned.

TECHNICAL FIELD

This invention relates to devices fabricated with III-V materials and more particularly to devices having a cap layer whose thickness can be varied to effect charge density.

CROSS-REFERENCE TO RELATED APPLICATIONS

Some of the subject matter hereof is disclosed and claimed in the copending U.S. patent applications entitled "Trimming Technique For Acoustic Change Transport Device"; Ser. No. 399,207; "Optically Modulated Acoustic Charge Transport Device", Ser. No. 283,624; "Acoustic Charge Transport Device Having Direct Optical Input", Ser. No. 283,618 and "A Monolithic Electro-Acoustic Device Having An Acoustic Charge Transport Device Integrated With A Transistor", Ser. No. 283,625, each of which is incorporated herein by reference.

BACKGROUND OF THE INVENTION

Acoustic charge transport (ACT) phenomena in III-V semiconductor material has only recently been demonstrated. Such devices have applications as high speed analog signal processors. Delay lines have been fabricated in gallium arsenide (GaAs) structures comprising a surface acoustic wave (SAW) transducer that launch a surface acoustic Wave along upper layers of GaAs or (AlGa)As substrate having transport channel formed therein. An input electrode sources charge to be transported by the propagating potential wells. There is also an electrode receiving a signal for modulating that charge. Spaced down the transport channel are one or more nondestructive sensing (NDS) electrodes for sensing the propagating charge. There is also an ohmic output electrode for removing the charge.

Initial acoustic charge transport devices were comprised of a thick epilayer (TE-ACT), With vertical charge confinement accomplished by means of an electro-static DC potential applied to metal field plates on the top and bottom surfaces of the GaAs substrate. The field plate potentials are adjusted to fully deplete the epilayer and produce a potential maximum near the midpoint thereof. Consequently, any charge injected into the channel is confined to the region of maximum DC potential.

Lateral charge confinement (Y direction) has been achieved in several Ways Typically, a mesa is formed to define a charge transport channel. However, for thick epilayer acoustic transport devices, the mesa must be several microns in height, a fact which presents problems in fabrication and is a major impediment to the propagating surface acoustic Wave. Blocking potentials extending down both sides of the delay line have also been used to define the transverse extent of the channel, as has proton bombardment to render the material surrounding the channel semi-insulating.

A heterostructure acoustic charge transport (HACT) device (HACT) has been fabricated using a GaAs/Al-GaAs heterostructure that is similar to that of quantum well lasers and heterostructure field effect transistors FET (e.g. HFET, MODFET, HEMT and TEGFET devices). A HACT device is comprised of a sequence of epitaxial layers and vertically confines mobile carriers through the placement of potential steps that result from band structure discontinuities. Besides providing for inherent vertical charge confinement, the HACT devices are thin film devices whose layers have a total thickness of approximately 0.25 microns, excluding a buffer layer.

A cap layer is provided With a HACT device both to protect an upper (AlGa)As layer and to permit fabrication of low resistance ohmic contacts and low leakage Schottky metalization. However, it is not possible to systematically and repeatedly produce a layered structure with the required sheet resistivity. Consequently, wafers must often be discarded because the grown resistivity of the device is not in an acceptable range. It would be advantageous to have a method and apparatus for fabricating III-V devices capable of adjusting the resistivity thereon after layer growth is complete, thereby reducing the number of unsuitable wafers and increasing device yield. The present invention is drawn towards such a device.

SUMMARY OF THE INVENTION

An object of the present invention is to provide a method and apparatus that selects the resistivity of an electronic device comprised of III-V material.

According to the present invention an acoustic charge transport device is formed on a piezoelectric semiconducting structure and includes a transducer fabricated on a first surface thereof for launching surface acoustic waves along a propagation axis. The surface acoustic waves are characterized by maxima and minima of electrical potential and provide transport for electric charge provided thereto. A reflector is formed on the surface at an end portion there adjacent to the transducer for reflecting the surface acoustic Waves. The device has a transport channel that is characterized by an intrinsic vertical electrical potential such that charge provided thereto is presented to the surface acoustic waves for transport. The channel is further formed to provide lateral and vertical confinement of the propagating charge. The device also includes an electrode configured With the transport channel at an end thereof distal to the transducer for generating an electrical signal equivalent of the propagating electrical charge. The device is characterized by the transport channel having a first layer of aluminum gallium arsenide grown on a gallium arsenide substrate; a first layer of gallium arsenide grown on the aluminum gallium arsenide layer; a second layer of doped aluminum gallium arsenide grown on the first layer of gallium arsenide and a second layer of gallium arsenide grown on the second layer of aluminum gallium arsenide, and wherein a selected amount of the second layer of gallium arsenide is removed, thereby increasing the sheet resistivity of the device.

DESCRIPTION OF THE PREFERRED EMBODIMENT

Figure 1:
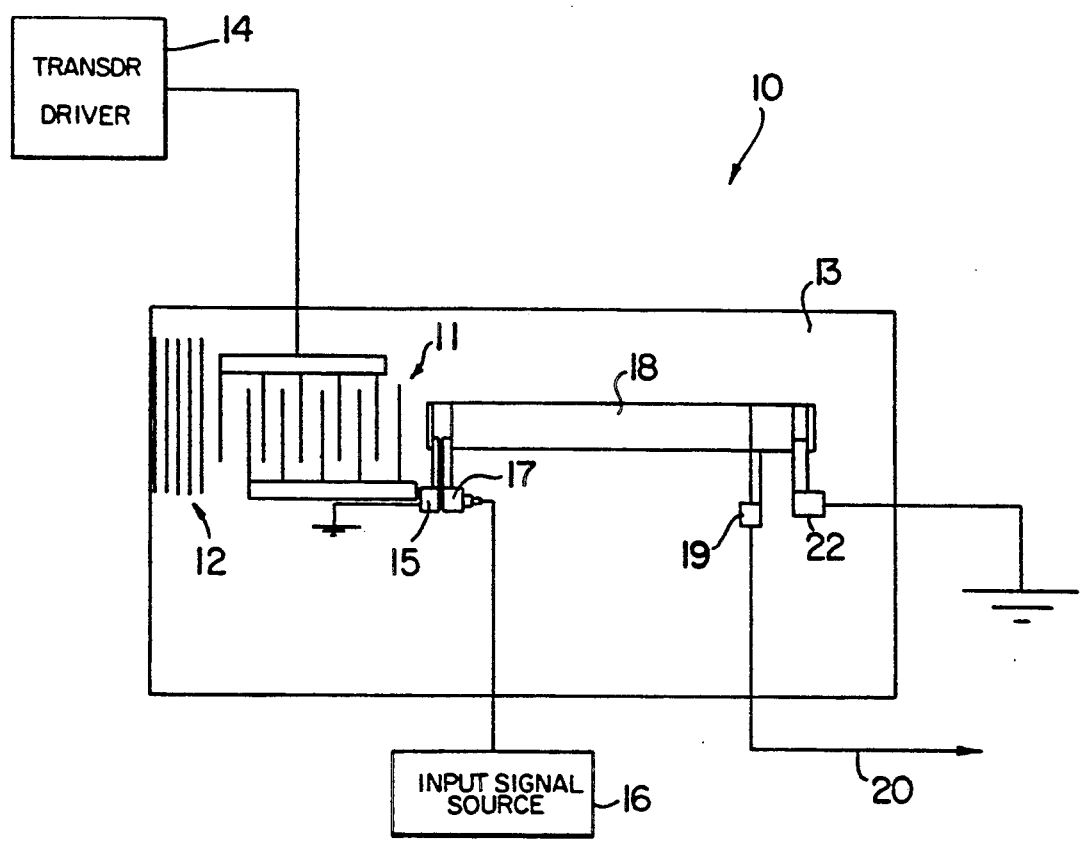
FIG. 1 is a simplified illustration of a heterostructure acoustic charge transport (HACT) device having epitaxial layers formed in accordance with the present invention.

Referring now to FIG. 1 there is a schematic illustration of an acoustic charge transport device provided according to the present invention. The device 10 is preferably comprised of a III-V material, such as GaAs and AlGaAs which is both piezoelectric and semiconducting. As is known, these materials are very closely lattice matched, having lattice parameters that differ by less than 0.04%. As a result, their ternary solutions are nearly ideal for preparation by epitaxial growth. In addition, the energy band gap of an AlGaAs compound $(Al_x, Ga_{1-x})As$ increases monotonically with the parameter x up to x approximately equal to 0.4, at which point the band gap of the ternary becomes indirect. Potential steps as large as 0.3 ev can be obtained in a heterostructure device. Moreover, the heterojunction band structure potential is a property of the composite material alone and is not diminished by the transport charge load.

On the surface of the device 10 there is formed a surface acoustic wave transducer 11 and reflector 12. The transducer is fabricated in a known manner and preferably comprises an interdigitated (IDT) transducer of aluminum copper alloy deposited on device top surface 13. A surface acoustic wave is launched along surface 13 via the transducer by means of signals presented by transducer driver 14. Similarly, the reflector 12 is of a known type and reflects the surface acoustic wave along the surface 16. Charge is provided via input ohmic contact 15 received by potential wells of the surface acoustic wave. The charge is modulated by means of signals from source 16 presented to input Schottky contact 17 and is propagated along a transport channel 18. Output Schottky electrode 19 provides signals on line 20 corresponding to the modulated charge presented thereto. Finally, the charge is extracted from the device at the output ohmic electrode 22.

The device 10 provides vertical charge confinement through formation of a potential well within a GaAs/AlGaAs layered structure using the differences in the conduction band energies of the contiguous layers. No external applied potentials are required for charge confinement in the vertical direction in the device 10. While lateral confinement of the propagating charge in the transport channel can be accomplished by conventional proton implant to produce a semi-insulating area surrounding the channel 18 on the surface, it is preferred to use mesa isolation.

Figure 2:
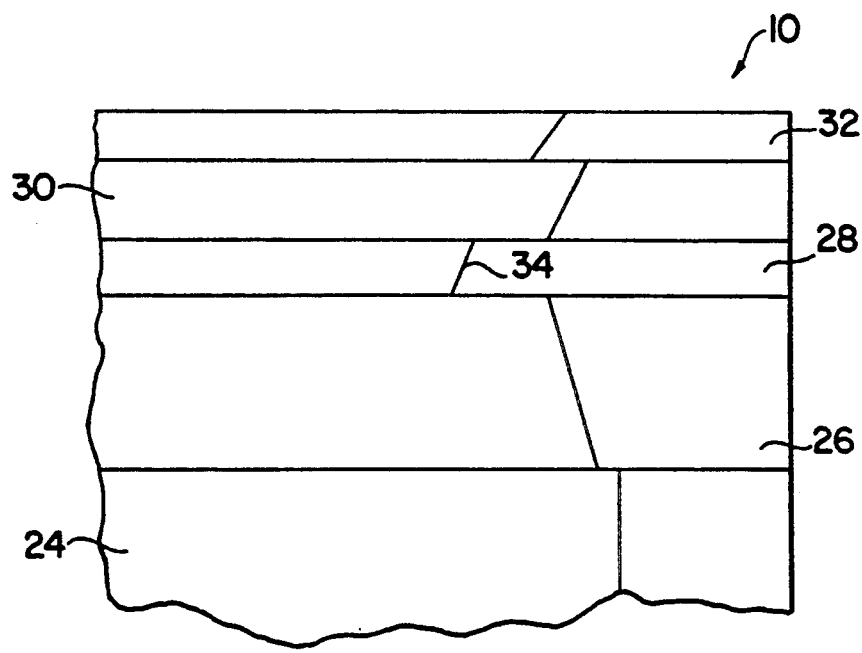
FIG. 2 is a diagrammatic illustration showing conduction band potential across several material layers in the device of FIG. 1.

FIG. 2 is a sectioned diagrammatic illustration of the device of FIG. 1, detailing the epitaxially grown layers thereof. Although the III-V layers detailed herein are preferably grown by molecular beam epitaxy (MBE), other epitaxial techniques which provide equivalent structural purity can be substituted. As described hereinabove, the device 10 is a thin film heterostructure device whose charge confinement layers have a total thickness typically less than 0.25 micron, excluding any buffer layer. On a semi-insulating GaAs substrate 24 there is formed a first, non-intentionally doped (NID) 100 nm thick layer 26 of (AlGa)As, which receives a 60 nm thick layer 28 of NID GaAs which forms the transport channel. A second, upper layer 30 of (AlGa)As is grown on the layer 28 with a doping in the range of $2 \times 10^{17}/cm^3$ and a thickness of about 70 nm. Finally, there is a 20 nm cap layer 32 of GaAs in order to prevent oxidation of the (AlGa)As charge control layer and to aid in electrical contact formation.

As demonstrated by the conduction band potentials shown in FIG. 2 (curve 34), a potential well 0.25 ev deep is created in the GaAs layer 28 which serves to confine the charge vertically in the transport channel. The thickness and doping level of the (AlGa)As layer 30 is designed to provide a sufficient number of electrons to fill the surface states therein while leaving the remainder of the structure essentially free of excess carriers. In the device of FIG. 1, a mole fraction of 32% aluminum was used. As noted above, the heterostructure structure described with respect to FIG. 2 provides for vertical charge confinement and eliminates the need for backgating consideration and external biasing that is otherwise necessary for conventional acoustic charge transport devices. The GaAs transport channel is undoped to provide high electron mobility, and there is an increased charge transfer efficiency due to a limited charge packet volume and lower bulk charge trapping. The transport channel formed in the device 10 differs from a double heterostructure FET devices in that the charge in a FET transistor is supplied by donors in the (AlGa)As layers. However, in the HACT device 10, the transport channel is ideally initially empty and charges are injected into the channel.

A HACT device must have a structure (i.e., substrate with the epilayers grown thereon) which is largely depleted in order to maximize the charge transfer efficiency by minimizing the undesired charge load. An acceptable level of depletion of the device structure has been attained experimentally. Starting with a device having an upper barrier layer 70 nm thick and charge control layer doped to about $2 \times 10^{17}/cm^3$ (parameters whose magnitude has been determined theoretically), the device resistivity is as measured in a lighted, clean room laboratory. The lighting is typically florescent lamps positioned about 10 feet from the contactless conductivity probe used to measure resistivity. It is necessary to measure device resistivity in a lighted laboratory because the resistivity of the device epitaxial layers is above the range (20,000 ohms/square) of the instrument when the device is in total darkness. The light produces charged carriers in the device epilayers which contribute to the conductivity of the material, and these carriers are sufficient to bring the resistivity into range of the instrument. The resistivity of the device is initially noted and devices are then fabricated. Devices with low measured resistivity vales (e.g., between 500 and 4000 ohms/sq.) have been used, but the HACT device charge transfer efficiency has been very poor due to the presence of excess free electrons. Devices with an initial measured resistivity between 4000 and 6000 ohms/sq. provide acceptable HACT performance.

In practice, the target doping level of the upper AlGaAs barrier layer is usually adjusted each time the MBE system is opened because the background doping and contamination level in the epitaxial layers change with each MBE system modification. Thus, the target doping level of the upper barrier can range between $1 \times 10^{17}/cm^3$ and $4 \times 10^{17}/cm^3$, depending on the cleanliness of the MBE system and the quality of the material sources therein. This target doping is determined experimentally by varying the doping (e.g., changing the silicon effusion cell temperature or making small changes in the barrier layer thickness) of the device epilayers until a resistivity between 3000 and 4000 ohms/sq. is achieved for as-grown layers by etching off the GaAs cap layer in small increments as set forth herein.

After device fabrication, conventional contactless conductivity probe measurements using contactless inductive probes are used to determine whether the substrate is underdoped, doped correctly or overdoped. The top layer is exposed to a dilute citric acid for several seconds prior to these measurements. In accordance with the present invention, devices which are overdoped have the sheet carrier density altered or "trimmed" to the correct value thereof by removing a portion of the top layer of the device. It is preferable that the top layer be removed by a chemical etchant consisting of 50% water and 50% hydrogen peroxchemide and ammonium peroxide as is required to bring the ph of the solution to 8.2. The preferred etchant removes gallium arsenide from the substrate at a rate of between 10 and 20 Angstroms per second and removes aluminum gallium arsenide having an aluminum/gallium ratio of 0.3 at a rate of 36 Angstroms per second.

Those skilled in the art will note that the sheet carrier density can be trimmed regardless of the doping or type of the layers which the device may possess. For example, in FIG. 2, cap layer 32 can be undoped or the cap layer 36 can be eliminated entirely, in which case "trimming" of the sheet carrier density is accomplished by removing a selected amount of the charge control layer 30.

With a device provided in accordance With the present invention, thinning the non-intentionally doped (NID) cap layer to 100 Angstroms produces an order of magnitude reduction in charge density as compared to an initial cap layer thickness of 200 Angstroms, i.e. $10^{16}/cm^3$ as compared with $10^{17}/cm^3$.

At the surface of GaAs cap layer, the Fermi level is known to be fixed, or pinned, at a level of about 0.8 volts below the conduction band minimum. This pinning is affected by the trapping of electrons, removed from the bulk of the material, at defect sites at the GaAs surface. In the structure of the device 10, the top (or cap) layer has been grown without intentional doping (i.e. the addition of electron donors or acceptors) and is generally only 20 to 40 nm thick. Below this cap layer is the upper trapping layer of (Al,Ga)As which is doped (on the order of $2 \times 10^{17}/cm^3$, donor atoms) in order to supply the electrons necessary to affect the pinning potential.

It has been found experimentally that optimum device performance is obtained when the sheet resistivity of the device (substrate and all epitaxial layers) is between 4000 and 6000 ohms/square. Resistivity in this range indicates that, in addition to the charge carriers present due to the resistivity measurement being made under room lighting, there are enough residual charges present to ensure that deep depletion is avoided. Deep depletion causes poor charge transfer efficiency because the injected electrons are absorbed by the epitaxial layer structure to satisfy native trap sites. The doping in the upper barrier layer must therefore supply charges to effect Fermi level pinning, as well as a small amount of charge to prevent deep depletion.

In the process of supplying the charges to the surface and the well, the upper barrier layer is depleted, and a capacitance is formed between the surface (negatively charged with electrons) and the barrier layer which is positively charged. The magnitude of the capacitance is directly proportional to the thickness of the GaAs cap layer. The amount of charge, Q, depleted to the surface is determined by the surface potential and the capacitance by the defining equation for capacitance, i.e.

$$C = Q/V$$

A more instructive form of the equation is $Q = C\, V$, since this form shows that, given a fixed Fermi level potential ($V = 0.8$ V), the amount of charge, Q, depleted to the surface will increase as the capacitance, C, increases. Since the amount of charge available is fixed (the upper barrier of (AlGa)As being fixed in thickness and doping level) the amount of charge available to deplete into the transport well, thereby contributing to the resistivity, is decreased as the cap is thinned and the capacitance thereby increased. As the amount of charge in the well decreases, the sheet resistivity increases. To be useful, it is necessary to ensure that the grown layers have a sheet resistivity lower than that desired because the process of partial cap removal can only be used to increase the sheet resistivity.

Similarly, although the invention has been shown and described with respect to a preferred embodiment thereof, it should be understood by those skilled in the art that various other changes, omissions and additions thereto may be made therein without departing from the spirit and scope of the present invention.

We claim:

1. A method of fabricating a semiconductor gallium arsenide device, comprising the steps of:
    growing a first layer of aluminum gallium arsenide on a gallium arsenide substrate;
    growing a first layer of gallium arsenide on said aluminum gallium arsenide layer;
    growing a second layer of aluminum gallium arsenide on said first layer of gallium arsenide;
    doping said second layer of aluminum gallium arsenide;
    growing a second layer of gallium arsenide on said second layer of aluminum gallium arsenide, said second layer of gallium arsenide having uncompensated surface states; and
    said second layer of aluminum gallium arsenide being doped to provide a device sheet resistivity of less than 4000 Ohms per square; and
    measuring the sheet resistivity of said device;
    removing a selected amount of said second layer of gallium arsenide in dependence on said measured resistivity of said second layer of gallium arsenide to bring said device sheet resistivity to substantially between 4000 and 6000 Ohms per square.

2. The method of claim 1 wherein said removing step comprises chemical etching said second gallium arsenide layer to a final thickness not less than one half of an initial second gallium arsenide layer thickness.

3. The method of claim 2 wherein said chemical etching step further comprises the steps of first etching a layer of oxide from said second layer of gallium arsenide with citric acid.

4. The method of claim 2 wherein said chemical etching step further comprises the steps of etching with a hydrochloric acid-hydrogen peroxide solution.

5. A method of fabricating a semiconducting device, comprising the steps of:

growing on a gallium arsenide substrate a first layer of aluminum gallium arsenide;

growing a first layer of gallium arsenide on said aluminum gallium arsenide layer;

growing a second layer of aluminum gallium arsenide on said first layer of gallium arsenide; and doping said second layer of aluminum gallium arsenide;

growing a second layer of gallium arsenide on said second layer of aluminum gallium arsenide;

said second layer of aluminum gallium arsenide being doped to provide a device sheet resistivity of less than 4000 Ohms per square;

measuring the sheet resistivity of said device: and removing a selected amount of said second layer of gallium arsenide in dependence on said measured resistivity of said second layer of gallium arsenide to bring said device sheet resistivity to substantially between 4000 and 6000 Ohms per square; and defining an acoustic charge transport structure on said layers including:

a transducer means fabricated on a first surface of the substrate for launching along a propagation axis surface acoustic waves characterized by maxima and minima of electrical potential which transports electric charge provided thereto;

a first electrode means for providing electrical charge of said gallium arsenide structure;

a transport channel in said gallium arsenide structure having a dimension extending parallel to said propagation axis characterized by an intrinsic vertical electrical potential for providing lateral and vertical confinement of charges presented thereto for transport by said surface acoustic waves;

a second electrode means for providing signals to modulate said propagating electrical charges; and a third electrode means configured with said transport channel at an end thereof distal to said transducer means for providing and electrical signal equivalent of said propagating electrical charge.

6. A method of fabricating a semiconducting device, comprising the steps of:

growing a first semiconducting layer on a semiconducting substrate;

growing a second semiconducting layer on said first layer;

growing a third semiconducting layer on said second layer;

growing a fourth semiconducting layer on said third semiconducting layer yielding a device sheet resistivity of less than 4000 Ohms per square;

said first and third semiconducting layers having a chemical composition that generates an electrical potential step relative to said second semiconducting layer so as to confine free electrical carriers to said second semiconducting layer measuring the device sheet resistivity device; and removing a selected amount of said fourth semiconducting layer in dependence on said measured device sheet resistivity of said fourth semiconducting layer to bring said device sheet resistivity to substantially between 4000 and 6000 Ohms per square.

7. The method of claim 6 further comprising the steps of growing an initial buffer layer of semiconducting material on said substrate.

8. The method of claim 7 wherein said removing step comprises chemical etching said fourth semiconducting layer to a final thickness not less than one half of an initial fourth semiconducting layer thickness.

* * * * *